(12) United States Patent
Tombers et al.

(10) Patent No.: US 9,170,277 B2
(45) Date of Patent: Oct. 27, 2015

(54) ELECTRICAL CONNECTION MODULE WITH INTERRUPTIBLE CIRCUIT

(75) Inventors: Roland Tombers, Paderborn (DE); Markus Becker, Paderborn (DE)

(73) Assignee: Phoenix Contact GMBH + Co. Kg (DE)

( * ) Notice: Subject to any disclaimer, the term of this patent is extended or adjusted under 35 U.S.C. 154(b) by 150 days.

(21) Appl. No.: 14/126,423

(22) PCT Filed: Jun. 13, 2012

(86) PCT No.: PCT/EP2012/002498
§ 371 (c)(1),
(2), (4) Date: Dec. 14, 2013

(87) PCT Pub. No.: WO2012/171639
PCT Pub. Date: Dec. 20, 2012

(65) Prior Publication Data
US 2014/0125323 A1  May 8, 2014

(30) Foreign Application Priority Data

Jun. 17, 2011  (DE) .......................... 10 2011 105 157

(51) Int. Cl.
*G01R 1/06* (2006.01)
*G01R 1/04* (2006.01)
(Continued)

(52) U.S. Cl.
CPC ............ *G01R 1/0416* (2013.01); *H01R 9/2491* (2013.01); *H01R 9/2666* (2013.01)

(58) Field of Classification Search
CPC ... G01R 1/0416; H01R 9/2491; H01R 9/2666
USPC ............... 324/754.01, 754.03, 754.1, 754.18, 324/754.2, 755.01, 755.11, 756.03, 757.03, 324/537, 500, 149, 76.11; 439/66–71, 327; 438/14–18
See application file for complete search history.

(56) References Cited

U.S. PATENT DOCUMENTS 2,092,652 A * 9/1937 Merriam ........................ 218/114
6,184,763 B1 * 2/2001 DeGrazia et al. ............. 335/202
(Continued)

FOREIGN PATENT DOCUMENTS

CH  648958  4/1985
DE  637238 A  10/1936
(Continued)

OTHER PUBLICATIONS

International Search Report of corresponding PCT application PCT/EP2012/002498.

*Primary Examiner* — Melissa Koval
*Assistant Examiner* — Trung Nguyen
(74) *Attorney, Agent, or Firm* — Anderson Gorecki & Rouille LLP (57) ABSTRACT

An electrical connecting module includes a first electrical connection terminal with a first connection pole and a second connection pole; a module element with a second electrical connection terminal, which comprises a first connection pole and a second connection pole, and with a third electrical connection terminal, which comprises a first connection pole and a second connection pole. A test channel is provided for accommodating a test probe. wherein the test channel is intended for making electrical contact with the second connection pole of the first connection terminal by means of the test probe when there is an electrical connection between the first connection pole of the first connection terminal and the first connection pole of the third connection terminal and when the electrical connection between the second connection pole of the first connection terminal and the second connection pole of the third connection terminal is disconnected.

15 Claims, 7 Drawing Sheets

(51) Int. Cl.
*H01R 9/24* (2006.01)
*H01R 9/26* (2006.01)

(56) References Cited

U.S. PATENT DOCUMENTS

| | | | |
|---|---|---|---|
| 6,811,425 | B1 | 11/2004 | Chiang |
| 7,381,073 | B2 * | 6/2008 | Yokoi et al. ............... 439/267 |
| 8,832,933 | B2 * | 9/2014 | Kuo et al. ................. 29/840 |
| 2002/0106926 | A1 | 8/2002 | Lindberg et al. |
| 2007/0257687 | A1 * | 11/2007 | Leon ........................ 324/754 |
| 2011/0028048 | A1 | 2/2011 | Rossman |
| 2011/0089961 | A1 * | 4/2011 | Ostmeier ............... 324/754.03 |
| 2012/0176122 | A1 * | 7/2012 | Hirata et al. ............ 324/149 |

FOREIGN PATENT DOCUMENTS

| | | |
|---|---|---|
| DE | 2348864 A | 4/1974 |
| DE | 19530947 A2 | 1/1997 |
| DE | 19748640 C1 | 3/1999 |
| DE | 102004040859 A1 | 3/2006 |
| DE | 20 2006 015897 | 3/2007 |
| EP | 0386277 A1 | 9/1990 |
| EP | 2280455 | 2/2011 |
| GB | 2065993 | 7/1981 |

* cited by examiner

ELECTRICAL CONNECTION MODULE WITH INTERRUPTIBLE CIRCUIT

The present invention relates to an electrical connection module with an interruptible circuit.

For establishing electric connections for industrial applications, connection modules are used, which provide e.g. screw connections or spring-cage connections. Such connection modules normally comprise a plurality of module elements with line connections, e.g. with screw connections or spring-cage connections for accommodating electric lines, and can be snapped onto a common mounting rail. An example for such a connection module is an analog module with module elements whose overall width is 6.2 mm. For detecting an electric current it is, however, necessary to switch a current measurement device into a current path. In the case of the known connection modules this, however, cannot be done without removing the lines from the respective connection poles. This is problematic, in particular when a plurality of module elements are snap-locked on the mounting rail side by side or arranged one on top of the other. If the connections of the respective module element are arranged one below the other, it will be necessary to release, for the purpose of removing a line from the lower connection, the line located above said lower connection, and this necessitates extra effort. The measurement expenditure is thus increased.

It is therefore the object of the present invention to provide an electrical connection module of the above-mentioned type, in which a current path can be interrupted without any necessity of removing the lines from the module elements in order to do so.

This object is achieved by the features of the independent claims. Advantageous further developments are subject matter of the description, the drawings and the dependent claims.

The present invention is based on the finding that a current path may also be interrupted within a module element. This has the advantageous effect that the lines need no longer be removed from the connection poles of the module element and can remain in the connection poles of the module element.

According to an aspect, the invention relates to an electrical connection module with a module housing, which comprises a first electrical connection terminal with a first connection pole and a second connection pole, a module element with a second electrical connection terminal, which comprises a first connection pole and a second connection pole, and with a third electrical connection terminal, which comprises a first connection pole and a second connection pole, and a test channel for the reception of a probe tip, wherein the first electrical connection terminal is electrically connectable to the third electrical connection terminal via the second electrical connection terminal, wherein, with an electric connection existing between the first connection pole of the first connection terminal and the first connection pole of the third connection terminal, the electric connection between the second connection pole of the first connection terminal and the second connection pole of the third connection terminal is separable, and wherein the test channel is provided for electrically contacting the second connection pole of the first connection terminal by means of the probe tip, with an electric connection existing between the first connection pole of the first connection terminal and the first connection pole of the third connection terminal and with a separated electric connection between the second connection pole of the first connection terminal and the second connection pole of the third connection terminal.

This has the advantageous result that an electric circuit across the first and second connection poles can, in spite of the separation of the electric connection between the second connection poles, still be conducted via the probe tip so that a particularly efficient current measurement will be possible.

The connection poles of the first connection terminal may e.g. be configured as connection pins. In this case the connection poles of the second connection terminal are configured as connection tulips. The connection poles of the first connection terminal may, however, be configured as connection tulips. In this case the connection poles of the second connection terminal are preferably configured as connection pins. A releasable plug connection between the first and the second connection terminal can thus be established in an advantageous manner. The connection poles of the first and of the second connection terminal may, however, also be clamping-type connection poles.

For electrically contacting the second connection pole of the first connection terminal, the probe tip may contact the second connection pole of the first connection terminal e.g. directly or indirectly, e.g. via the second connection terminal.

According to an embodiment, an elastic clamping contact is provided for electrically connecting the second connection pole of the second connection terminal to the second connection pole of the third connection terminal, the elastic clamping contact being elastically deflectable by means of the probe tip, which is insertable in the test channel, so as to separate the electric connection between the second connection pole of the second connection terminal and the second connection pole of the third connection terminal for the separation of the electric connection between the second connection pole of the first connection terminal and the second connection pole of the third connection terminal. When the second connection poles of the first and of the second connection terminal are electrically connected e.g. via a plug connection, the electric connection between the second connection poles of the first and of the third connection terminal is accomplished automatically, through use of the elastic clamping contact, by the second connection pole of the second or of the third connection terminal.

According to an embodiment, a retaining portion of the elastic clamping contact is electrically connected to the second connection pole of the second connection terminal, and a contact portion of the elastic clamping contact presses at a position of rest against the second connection pole of the third connection terminal, or a retaining portion of the elastic clamping contact is electrically connected to the second connection pole of the third connection terminal, and a contact portion of the elastic clamping contact presses at a position of rest against the second connection pole of the second connection terminal; the second connection pole of the first connection terminal and the first connection pole of the second connection terminal are connected via an electrical plug connection; and the contact portion of the elastic clamping contact is deflectable from the position of rest to a deflected position for separating the electric connection. The retaining portion of the elastic clamping contact may be permanently connected to the respective second connection pole, e.g. by means of a conductive adhesive connection or a solder connection. At the deflected position of the contact portion, the electric contact between the contact portion and the second connection pole is separated, whereby a current path can be interrupted. If no deflection takes place, the elastic clamping contact will remain at or return to the position of rest and ensure an electric contact between the second connection poles.

According to an embodiment, the elastic clamping contact is a flectionally-elastic bracket.

According to an embodiment, the first connection terminal and the second connection terminal are electrically connectable via a plug connection.

According to an embodiment, the first connection pole and the second connection pole of the first connection terminal are formed as connection pins, and the first connection pole and the second connection pole of the second connection terminal are formed as connection tulips into which the connection pins are insertable for establishing the electric connection, or the first connection pole and the second connection pole of the first connection terminal are formed as connection tulips, and the first connection pole and the second connection pole of the second connection terminal are formed as connection pins, which are insertable into the connection tulips for establishing the electric connection.

According to an embodiment, the second connection pole of the first connection terminal is shorter than the first connection pole of the first connection terminal so that, with an electric connection existing between the first connection pole of the first connection terminal and the first connection pole of the second connection terminal, the electric connection between the second connection pole of the first connection terminal and the second connection pole of the second connection terminal is separable, or the second connection pole of the second connection terminal is shorter than the first connection pole of the second connection terminal so that, with an electric connection existing between the first connection pole of the first connection terminal and the first connection pole of the second connection terminal, the electric connection between the second connection pole of the first connection terminal and the second connection pole of the second connection terminal is separable. This has the advantageous effect that, when the module element is pushed out of the module housing, only the electric connection between the second connection poles will be interrupted, whereas the electric connection between the first connection poles remains. In this way, the current path is interrupted at a defined point and can be continued via a probe tip, e.g. for the purpose of current measurement.

According to an embodiment, the module element is pushable out of the module housing via a predetermined displacement path so as to separate the electric connection between the second connection poles.

According to an embodiment, the predetermined displacement path is delimited by a detent element. The detent element may e.g. be a locking projection or a locking recess, which may be arranged on the module element or on a wall of the module housing, in particular on a wall of a module reception means of the module housing. A displacement path for measurement purposes is thus defined in an advantageous manner.

According to an embodiment, the test channel is formed in the module element and extends up to the clamping contact. The test channel may e.g. be formed by an opening in the module element.

According to an embodiment, the test channel is formed in the module housing and extends up to the second connection pole of the first connection terminal. The test channel may e.g. be formed by an opening in the module housing.

According to an embodiment, the third electrical connection terminal is provided for the releasable reception of electric lines, in particular for the force-fit reception. To this end, the third electrical connection terminal may have connection poles, which are e.g. clamping-type connection poles or screw-type connection poles.

The connection poles of the third connection terminal are preferably arranged one below the other in a row and provided for the releasable reception of electric line ends.

According to an embodiment, the module housing has a module reception means, delimited by side walls, for the reception of the module element, and the module element is arranged in the module reception means or insertable into the module reception means. The module reception means may be provided for receiving therein a plurality of module elements one below the other or one on top of the other. The module reception means preferably has a width corresponding to the width of a module element. The module reception means has formed therein e.g. reception recesses, in which connection poles of the first connection terminal are arranged.

According to an embodiment, the connection poles of the third connection terminal are arranged one below the other.

According to a further aspect, the invention relates to a method for detecting a current strength of an electric current flowing through the electrical connection module, with: applying a first probe tip of a current measurement device to the first connection pole of the third connection terminal; separating an electric connection between the second connection pole of the first connection terminal and the second connection pole of the third connection terminal, with an electric connection existing between the first connection pole of the first connection terminal and the first connection pole of the third connection terminal; electrically contacting the second connection pole of the first connection terminal by means of a second probe tip conducted through the test channel; and detecting the current strength of the electric current flowing between the first probe tip and the second probe tip.

Further features of the method result directly from the features of the electrical connection module.

Additional embodiments are explained making reference to the enclosed drawings, in which.

Figure 1:
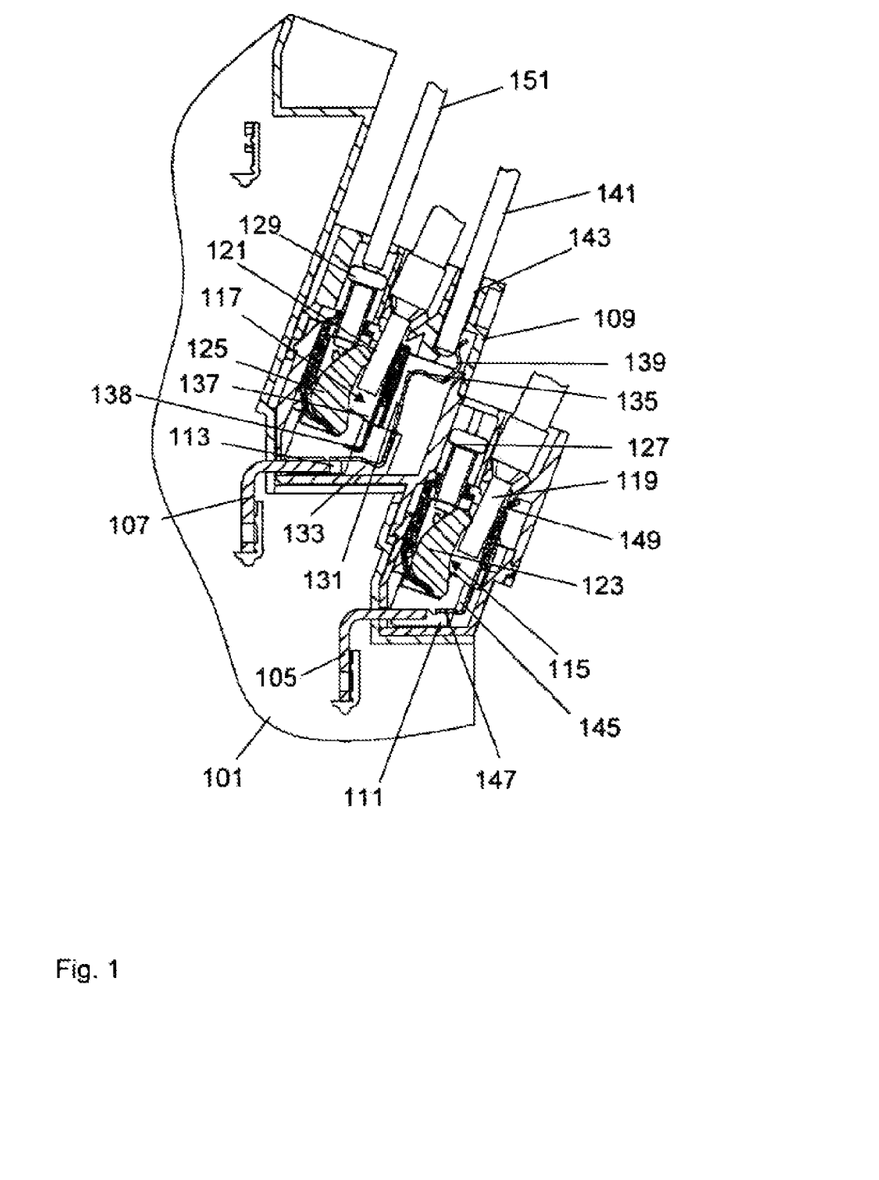
FIG. 1 shows a detail of an electrical connection module according to an embodiment.

FIG. 1 shows an electrical connection module with a module housing 101, comprising a first connection terminal 105, 107 with a first connection pole 105 and a second connection pole 107. The connection poles 105, 107 are configured e.g. as connection pins. They may, however, also be configured as connection tulips.

The electrical connection module additionally comprises a module element 109 comprising a second connection terminal 111, 113 with a first connection pole 111 and a second connection pole 113. The connection poles 111, 113 of the second connection terminal 111, 113 may e.g. be configured as connection tulips. They may, however, also be configured as connection pins. The connection poles 105, 107 of the first connection terminal 105, 107 as well as the connection poles 111, 113 define e.g. an electrical plug connection. The module element 109 may thus be configured as a multi-pole, in particular as a two-pole plug.

The module element 109 additionally comprises a third connection terminal 115, 117 with a first connection pole 115 and a second connection pole 117. The third connection terminal 115, 117 is e.g. provided for receiving therein electric lines in a force-fit and releasable manner. To this end, the connection poles 115, 117 may be configured as screw-type connection poles comprising each a screw 127, 129 which acts on a respective clamping body 123, 125.

For establishing an electric connection between the first connection terminal 105, 107 and the third connection terminal 115, 117, the first connection terminal 105, 107 is electrically connected to the second connection terminal 111, 113, e.g. by means of a plug connection. With an electric connection existing between the first connection pole 111 of the second connection terminal 111, 113 and the first connection pole 115 of the third connection terminal 115, 117, the electric connection between the second connection pole 113 of the second connection terminal 111, 113 and the second connection pole 117 of the third connection terminal 115, 117 can be interrupted.

An elastic clamping contact 131, e.g. an elastic bending bracket, is, by way of example, provided for interrupting the electric connection between the second connection poles 113, 117. The spring contact has a retaining portion 133 thereof permanently electrically connected, e.g. by soldering, to the second connection 113 of the second connection terminal 111, 113. The clamping contact 131 additionally comprises a contact portion 135, which is pressable against a contact portion 137 of the second connection pole 117 of the third connection terminal 115, 117. The contact portion 137 can have connected thereto e.g. the electric line 119. The contact portion 137 may e.g. be bent and have an angled retaining portion 138 which may, for example, be anchored in a plastic portion of the module element 109.

For separating the connection between the second connection poles 113, 117, the clamping contact 131 comprises a bent reception portion 139 for the reception of a probe tip 141 which can be inserted from outside through a test channel 143 extending up to the clamping contact 131, so as to displace the clamping contact 131.

Irrespectively of an existing or non-existing electric connection between the second connection poles 113, 117, the first connection pole 111 of the second connection terminal 111, 113 is electrically connectable or connected to the first connection 115 of the first connection terminal 105, 107. To this end, a connection contact 145, e.g. a connection bridge, is provided, which is permanently connected, e.g. by soldering, to the first connection pole 111 of the second connection terminal 111, 113 via a retaining portion 147 that may be bent. The connection contact 145 additionally comprises a contact portion 149, which is pressable against a line end 121 and which can e.g. not be bent open. The electric connection between the first connection poles 105, 111 and 115 may e.g. correspond to a conventional electrical screw-type pole connection.

If an electric load is connected to the electric lines 119, 121, an electric current will flow through the electrical connection element across the respective first connection poles 105, 111, 115 and across the respective second connection poles 107, 113 and 117, which define a current path. For interrupting the current path, the probe tip 141 is inserted into the test channel 143, whereby the elastic clamping contact 131 is bent open, so that the electric connection between the second connection poles 113, 117 is interrupted. The clamping contact 131 is, however, connected to the probe tip 141 via the reception portion 139. If the additional probe tip 151 is electrically connected e.g. to the conductive screw 129, the current path will be recompleted via the probe tips 141, 151, so that the current I shown in FIG. 1 will flow e.g. in the directions indicated by the arrows shown in FIG. 1.

Figure 2:
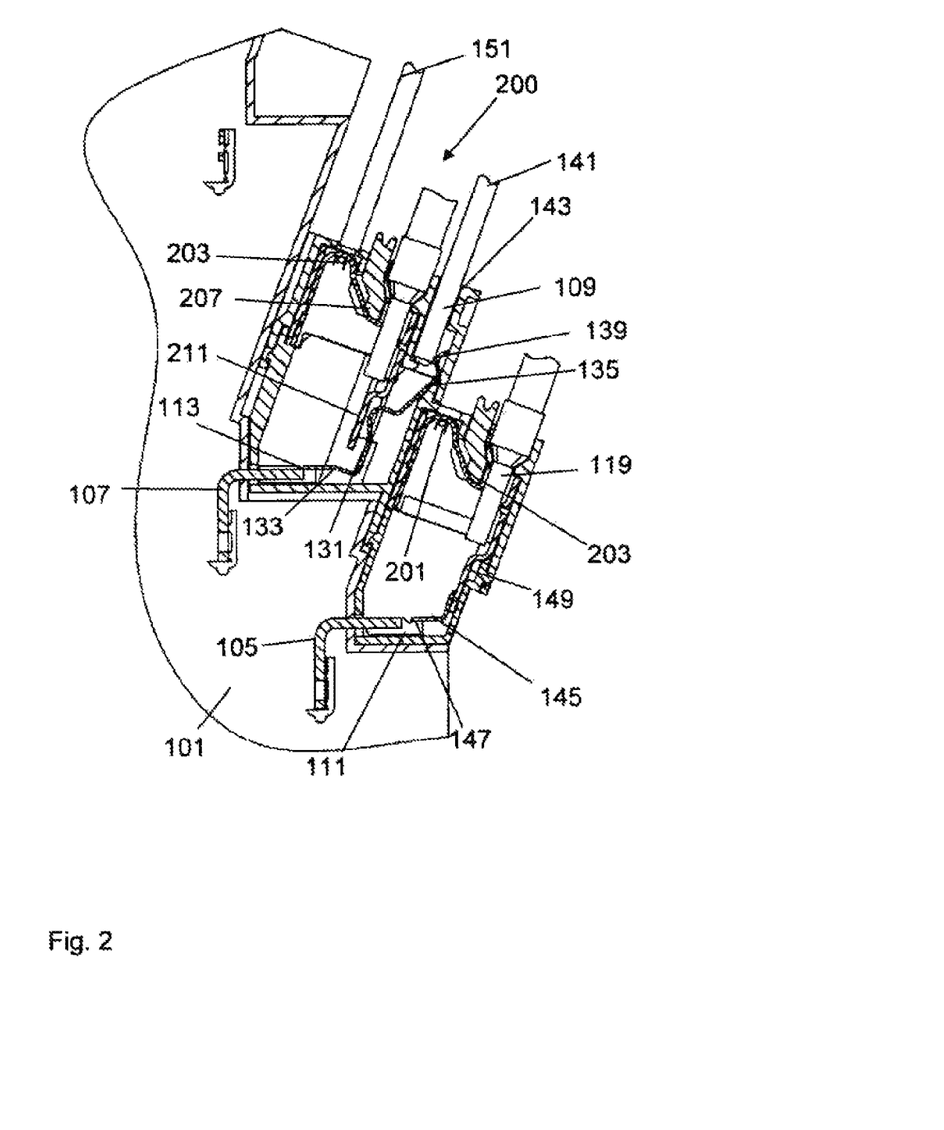
FIG. 2 shows a detail of an electrical connection module according to an embodiment.

FIG. 2 shows a detail of an electrical connection element comprising a module element 200 comprising, other than the electrical connection element shown in FIG. 2, a third connection terminal 201, 203 with a first connection pole 201 and a second connection pole 203 provided for the clamping reception of electric lines 119, 121. Here, the first connection pole 201 and the second connection pole 203 each comprise a terminal clamp 205 and 207.

For establishing an electric connection between the second connection poles 113, 203, the clamping contact 131 can, as has already been explained in connection with FIG. 1, be displaced and pressed against a contact portion 209, respectively. The contact portion 209 can be brought into electrical contact with the electric line 119 by means of the terminal clamp 207 and comprises a retaining portion 211, which is for example embedded in a housing material, e.g. plastic material, of the module element 200.

The mode of operation of the connection element shown in FIG. 2 corresponds to the mode of operation of the electrical connection element shown in FIG. 1, with the difference that clamped connections are used instead of the screw-type pole connections.

Figure 3:
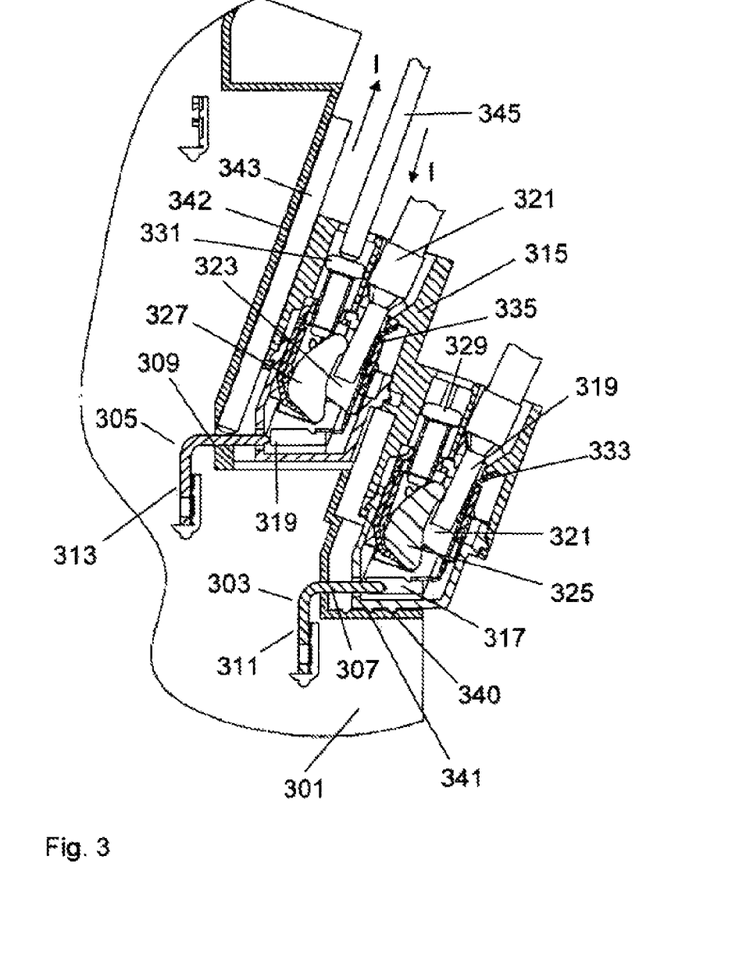
FIG. 3 shows a detail of an electrical connection module according to an embodiment.

FIG. 3 shows an electrical connection element with a module housing 301, wherein a first connection terminal 303, 305 with a first connection pole 303 and a second connection pole 305 is provided. The connection poles 303, 305 are e.g. pin-type connections or tulip-type connections, which each comprise a contact portion 307, 309 with a respective angled retaining portion 311, 313.

The module housing 301 is provided for accommodating at least one module element 315. The module element comprises a second connection terminal with a first connection pole 317 and a second connection pole 319, which may each be configured as tulip-type connection poles or as pin-type connection poles. The electrical connection module additionally comprises a third connection terminal 321, 323, which may e.g. comprise conventional screw-type pole connections comprising each a clamping body 325, 327, a clamping screw 329, 331 as well as a contact portion 333, 335. The contact portions 333, 335 can be connected to the electric lines 119, 121 by means of the clamping bodies 325, 327, whereby an electric connection can be established between the electric lines 119, 121 and the third connection terminal 321, 323.

The electric connection between the second connection poles 305, 319 of the first connection terminal 303, 305 and the second connection terminal 317, 319 can be interrupted even if an electric connection exists between the first connection poles 303, 317. To this end, the effective contact portion 309 of the second connection pole 305 is e.g. shorter than the contact portion 307 of the first connection pole 303. If the module element 315 is e.g. pushed out of the module housing 301 along a predetermined displacement path, the electric connection between the second connection poles 305, 319 can be interrupted due to the difference in length between the contact portions 307, 309, since e.g. the contact portion 309 is removed from the connection pole 319, which may be configured as a connection tulip. With the given defined displacement path, the electric connection between the first connection poles 303, 317 will, however, still exist, since, although the module element 315 is displaced, the longer contact portion 307 of the first connection pole 303 will e.g. remain in the connection tulip 317. The current path can be interrupted in this way. For delimiting the displacement path, e.g. one or a plurality of recesses 340 may be provided on a bottom wall of a module reception means of the module housing accommodating the module element. The module element 315 may be provided with complementary raised portions 341, e.g. locking projections, which enter the recesses 340, for this purpose.

For contacting the second connection pole 305 of the first connection terminal 303, 305, a test channel 342 is provided, into which a probe tip 343 can be inserted. An additional probe tip 345 may be brought into contact e.g. with the screw 331 for completing the current path, so that an electric current will flow e.g. across the probe tips 343, 345.

According to an embodiment, the screw-type connection poles shown in FIG. 3 can be replaced by clamping-type connection poles.

Figure 4:
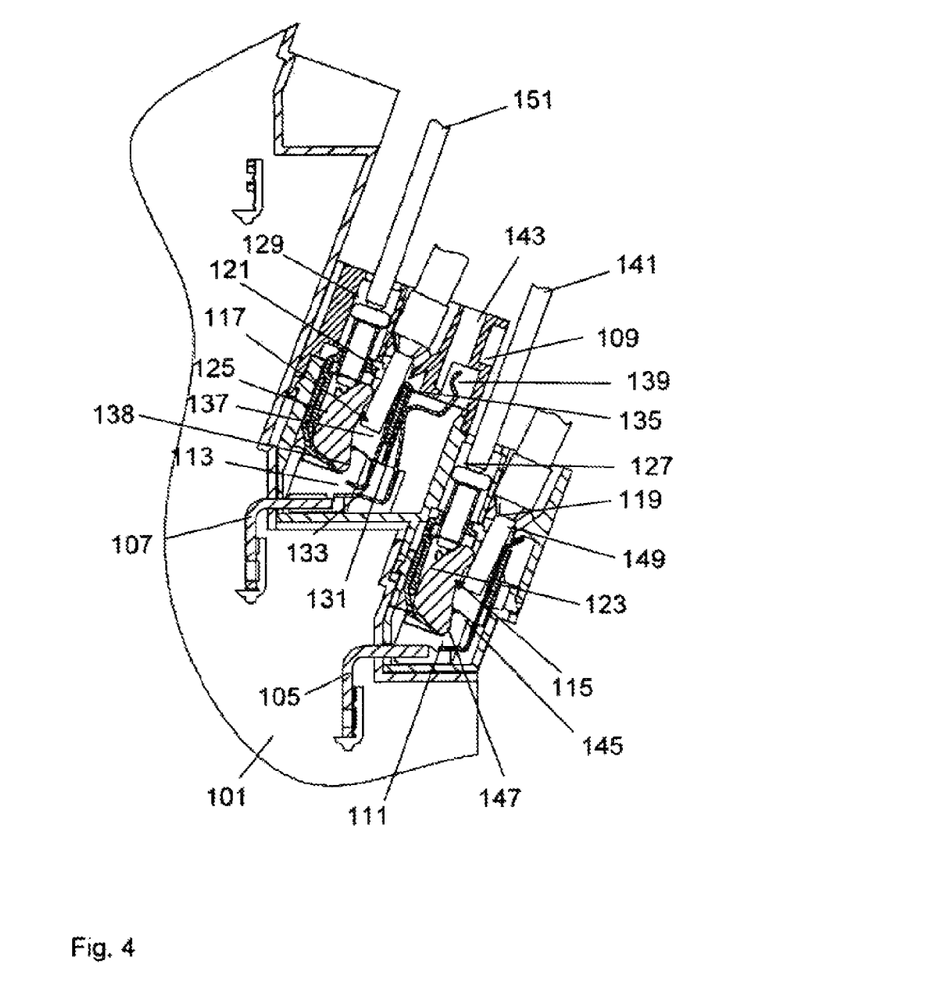
FIG. 4 shows a detail of an electrical connection module according to an embodiment.

FIG. 4 shows the electrical connection module according to FIG. 1 in the case of a voltage measurement in which the probe tips 141, 151 directly contact the screws 127, 129. The clamping contact 131 is at its position of rest and presses against the contact portion 137 of the second connection pole 117 of the second connection terminal 115, 117.

Figure 5:
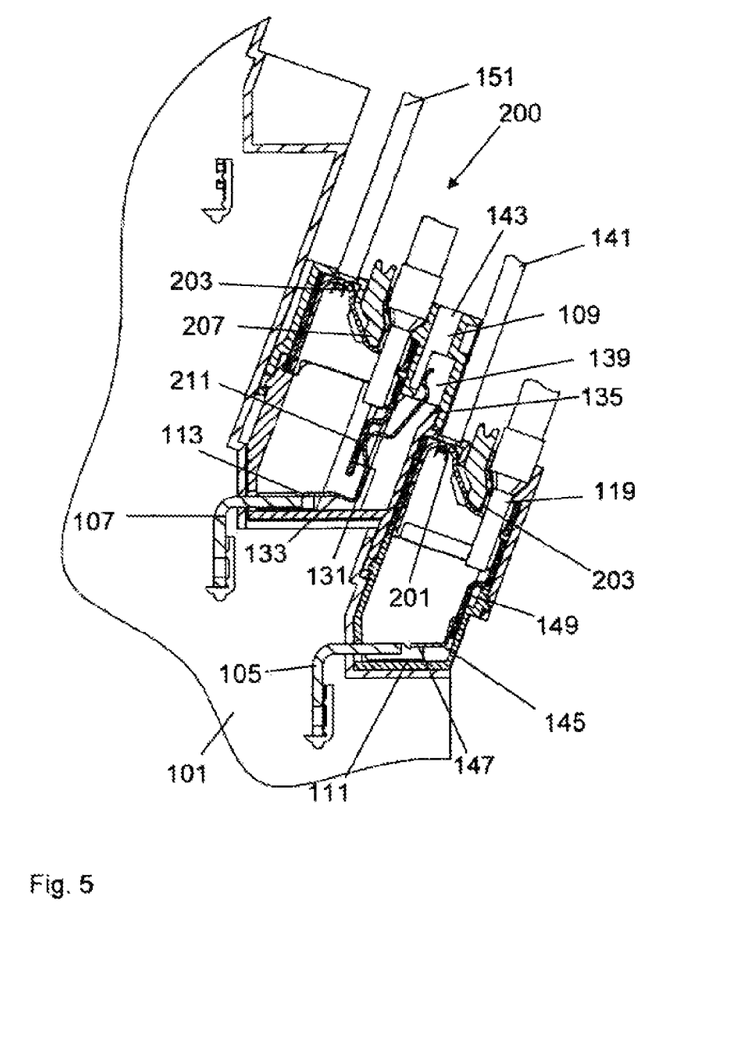
FIG. 5 shows a detail of an electrical connection module according to an embodiment.

FIG. 5 shows the electrical connection module according to FIG. 2 in the case of a voltage measurement in which the probe tips 141, 151 directly contact the terminals 201, 203.

Figure 6:
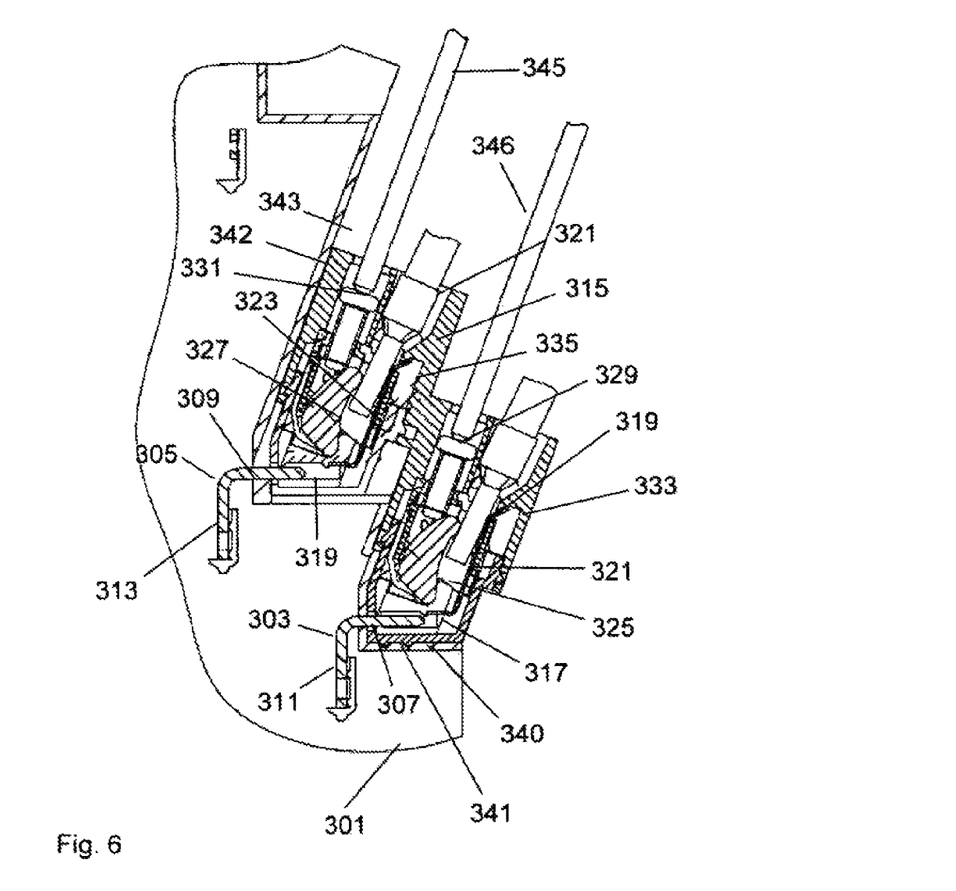
FIG. 6 shows a detail of an electrical connection module according to an embodiment.

FIG. 6 shows the electrical connection module according to FIG. 3 in the case of a voltage measurement in which the probe tips 345, 346 directly contact the screws 127, 129. The clamping contact 131 is at its position of rest and presses against the contact portion 137 of the second connection pole 117 of the second connection terminal 115, 117.

Figure 7:
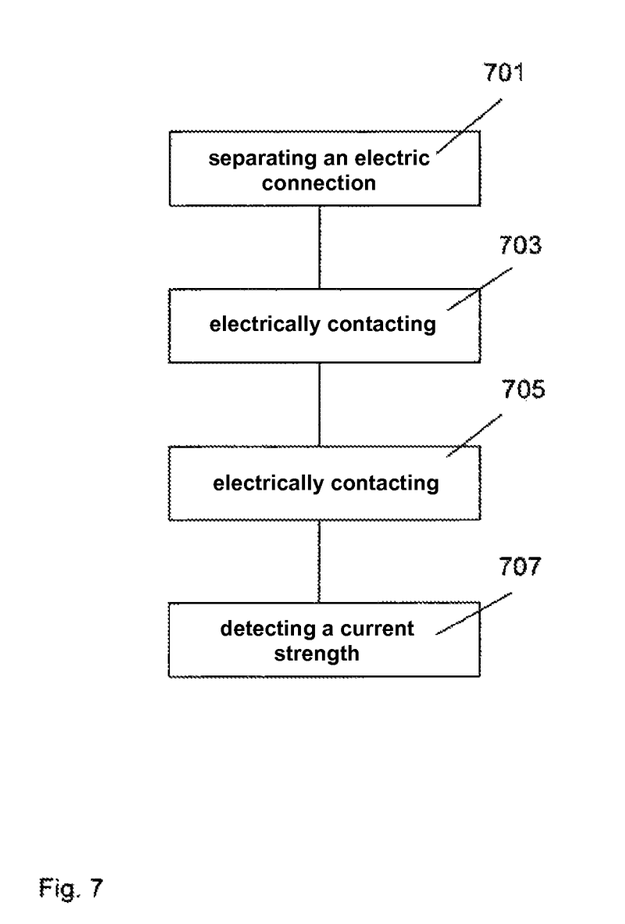
FIG. 7 shows a diagram of a method for detecting a current strength according to an embodiment.

FIG. 7 shows a diagram of a method for detecting a current strength of an electric current flowing through an electrical connection module, e.g. through one of the electrical connection modules shown in FIG. 1 to 4. The method comprises: separating 701 an electric connection between the second connection pole of the first connection terminal and the second connection pole of the third connection terminal, electrically contacting 703 the second connection pole of the first connection terminal by means of a first probe tip conducted through the test channel, electrically contacting 703 the second connection pole of the third connection terminal by means of a second probe tip, with an electric connection existing between the first connection pole of the first connection terminal and the first connection pole of the third connection terminal, and detecting 707 the current strength of the electric current flowing between the first probe tip and the second probe tip by means of the current measurement device.

The steps of separating 701 and electrically contacting 703 may be carried out simultaneously or in succession. Also the contacting steps 7703, 705 may be carried out simultaneously or in succession.

For electrically contacting the second connection pole of the first connection terminal, the probe tip may contact the second connection pole of the first connection terminal e.g. directly or indirectly, e.g. via the second connection terminal.

Further steps of the method shown in FIG. 7 directly result from the functionality of the electrical elements shown in FIG. 1 to 6.

The mode of operation of the electrical connection elements shown in FIG. 1 to 6 has been explained taking the separation of the electric connection between the second terminal poles as an example. However, the above statements apply analogously also in the event that the electric connections are interrupted between the first connection poles instead of the second connection poles. The above statements apply, however, analogously also in the event that the electric connections are interrupted between the first connection poles as well as between the second connection poles.

LIST OF REFERENCE NUMERALS

101 module housing
105, 107 connection terminal
109 module element
111, 113 connection terminal
115, 117 connection terminal
119 electric line
121 electric line
123 clamping body
125 clamping body
127 screw
129 screw
131 clamping contact
133 retaining portion
135 contact portion
137 contact portion
138 retaining portion
139 reception portion
141 probe tip
143 test channel
145 connection contact
147 retaining portion
149 contact portion
151 additional probe tip
200 module element
201, 203 connection terminal
205 terminal clamp
207 terminal clamp
209 contact portion
211 retaining portion
301 module housing
303, 305 connection terminal
307 contact portion
309 contact portion
311 retaining portion
313 retaining portion
315 module element
317, 319 connection terminal
321, 323 connection terminal
325 clamping body
327 clamping body
329 clamping screw
331 clamping screw
333 contact portion
335 contact portion
340 recess
341 raised portion
342 test channel
343 probe tip
345 probe tip
346 probe tip
401 module element
403, 405 connection terminal
405 connection terminal
407 clamping body
409 clamping body
411 screw
413 screw
701 applying a probe tip
705 electrically contacting
707 detecting the current strength

What is claimed is:
1. An electrical connection module, comprising:
a module housing comprising a first electrical connection terminal with a first connection pole and a second connection pole;
a module element with a second electrical connection terminal, which comprises a first connection pole and a second connection pole, and with a third electrical connection terminal, which comprises a first connection pole and a second connection pole; and
a test channel for the reception of a probe tip;
wherein the first electrical connection terminal is electrically connectable to the third electrical connection terminal via the second electrical connection terminal, wherein, with an electric connection existing between the first connection pole of the first connection terminal and the first connection pole of the third connection terminal, the electric connection between the second connection pole of the first connection terminal and the second connection pole of the third connection terminal is separable, and wherein the test channel is provided for electrically contacting the second connection pole of the first connection terminal by means of the probe tip, with an electric connection existing between the first connection pole of the first connection terminal and the first connection pole of the third connection terminal and with a separated electric connection between the second connection pole of the first connection terminal and the second connection pole of the third connection terminal.

2. The electrical connection module according to claim 1, wherein a clamping contact is provided for electrically connecting the second connection pole of the second connection terminal to the second connection pole of the third connection terminal, wherein the clamping contact is deflectable by means of the probe tip, which is insertable in the test channel, so as to separate the electric connection between the second connection pole of the second connection terminal and the second connection pole of the third connection terminal for the separation of the electric connection between the second connection pole of the first connection terminal and the second connection pole of the third connection terminal.

3. The electrical connection module according to claim 2,
wherein a retaining portion of the clamping contact is electrically connected to the second connection pole of the second connection terminal and wherein a contact portion of the clamping contact presses at a position of rest against the second connection pole of the third connection terminal, or
wherein a retaining portion of the clamping contact s electrically connected to the second connection pole of the third connection terminal and wherein a contact portion of the clamping contact presses at a position of rest against the second connection pole of the second connection terminal;
wherein the second connection pole of the first connection terminal and the second connection pole of the second connection terminal are connected via an electrical plug connection; and
wherein the contact portion of the clamping contact is deflectable from the position of rest to a deflected position for separating the electric connection.

4. The electrical connection module according to claim 3, wherein the clamping contact is a flectionally-elastic bracket.

5. The electrical connection module according to claim 1, wherein the first connection terminal and the second connection terminal are electrically connectable via a plug connection.

6. The electrical connection module according to claim 5, wherein the first connection pole and the second connection pole of the first connection terminal are formed as connection pins, and wherein the first connection pole and the second connection pole of the second connection terminal are formed as connection tulips into which the connection pins are insertable for establishing the electric connection, or
wherein the first connection pole and the second connection pole of the first connection terminal are formed as connection tulips, and wherein the first connection pole and the second connection pole of the second connection terminal are formed as connection pins which are insertable into the connection tulips for establishing the electric connection.

7. The electrical connection module according to claim 6:
wherein the second connection pole of the first connection terminal is shorter than the first connection pole of the first connection terminal so that, with an electric connection existing between the first connection pole of the first connection terminal and the first connection pole of the second connection terminal, the electric connection between the second connection pole of the first connection terminal and the second connection pole of the second connection terminal is separable, or
wherein the second connection pole of the second connection terminal is shorter than the first connection pole of the second connection terminal so that, with an electric connection existing between the first connection pole of the first connection terminal and the first connection pole of the second connection terminal, the electric connection between the second connection pole of the first connection terminal and the second connection pole of the second connection terminal is separable.

8. The electrical connection module according to claim 7, wherein for separating the electric connection between the second connection poles, the module element is pushable out of the module housing via a predetermined displacement path.

9. The electrical connection module according to claim 8, wherein the predetermined displacement path is delimited by a detent element.

10. The electrical connection module according to claim 2, wherein the test channel is formed in the module element and extends up to the clamping contact.

11. The electrical connection module according to claim 7, wherein the test channel is formed in the module housing and extends up to the second connection pole of the first connection terminal.

12. The electrical connection module according to claim 1, wherein the third electrical connection terminal is provided for the releasable reception of electric lines, in particular for the force-fit reception.

13. The electrical connection module according to claim 1, wherein the module housing has a module reception means for the reception of the module element, and wherein the module element is arrangeable in the module reception means or insertable into the module reception means.

14. The electrical connection module according to claim 1, wherein the connection poles of the third connection terminal are arranged one below the other.

15. A method for detecting a current strength of an electric current flowing through the electrical connection module, the electrical connection module comprising:
a module housing comprising a first electrical connection terminal with a first connection pole and a second connection pole;

a module element with a second electrical connection terminal, which comprises a first connection pole and a second connection pole, and with a third electrical connection terminal, which comprises a first connection pole and a second connection pole; and a test channel for the reception of a probe tip;

wherein the first electrical connection terminal is electrically connectable to the third electrical connection terminal via the second electrical connection terminal, wherein, with an electric connection existing between the first connection pole of the first connection terminal and the first connection pole of the third connection terminal, the electric connection between the second connection pole of the first connection terminal and the second connection pole of the third connection terminal is separable, and wherein the test channel is provided for electrically contacting the second connection pole of the first connection terminal by means of the probe tip, with an electric connection existing between the first connection pole of the first connection terminal and the first connection pole of the third connection terminal and with a separated electric connection between the second connection pole of the first connection terminal and the second connection pole of the third connection terminal the method comprising the steps of:

separating an electric connection between the second connection pole of the first connection terminal and the second connection pole of the third connection terminal;

electrically contacting the second connection pole of the first connection terminal by means of a first probe tip conducted through the test channel;

electrically contacting the second connection pole of the third connection terminal by means of a second probe tip, with an electric connection existing between the first connection pole of the first connection terminal and the first connection pole of the third connection terminal; and detecting the current strength of the electric current flowing between the first probe tip and the second probe tip.

* * * * *